United States Patent
Peng et al.

(10) Patent No.: US 6,599,578 B2
(45) Date of Patent: Jul. 29, 2003

(54) METHOD FOR IMPROVING INTEGRATED CIRCUITS BONDING FIRMNESS

(75) Inventors: Jeng-Jie Peng, Tao-Yuan (TW); Ming-Dou Ker, Hsinchu (TW); Nien-Ming Wang, Hsinchu (TW)

(73) Assignee: Industrial Technology Research Institute (TW)

(*) Notice: Subject to any disclaimer, the term of this patent is extended or adjusted under 35 U.S.C. 154(b) by 0 days.

(21) Appl. No.: 10/224,360

(22) Filed: Aug. 21, 2002

(65) Prior Publication Data

US 2002/0197458 A1 Dec. 26, 2002

Related U.S. Application Data

(62) Division of application No. 09/221,569, filed on Dec. 29, 1998, now Pat. No. 6,444,295.

(51) Int. Cl.[7] .................................................. B05D 1/36
(52) U.S. Cl. .................... 427/402; 427/419.1; 427/404; 228/180.22; 228/180.5; 257/786; 257/784
(58) Field of Search .......................... 427/96, 402, 404, 427/419.1; 228/180.22, 180.5; 257/784, 786

(56) References Cited

U.S. PATENT DOCUMENTS

| | | | |
|---|---|---|---|
| 4,347,304 A | * 8/1982 | Sakurai et al. | 430/291 |
| 4,751,146 A | * 6/1988 | Maeda et al. | 428/475.8 |
| 5,045,919 A | 9/1991 | Nagaoka | |
| 5,202,222 A | * 4/1993 | Harris et al. | 430/315 |
| 5,430,329 A | 7/1995 | Harada et al. | |
| 5,686,762 A | 11/1997 | Langley | |
| 5,695,592 A | 12/1997 | Rouaud et al. | |
| 5,707,894 A | 1/1998 | Hsiao | |
| 5,753,975 A | 5/1998 | Matsuno | |
| 5,874,779 A | 2/1999 | Matsuno | |
| 6,210,537 B1 | * 4/2001 | Murphy et al. | 204/157.5 |

* cited by examiner

*Primary Examiner*—Cathy Lam
(74) *Attorney, Agent, or Firm*—McDermott, Will & Emery

(57) ABSTRACT

A method for improving the integrated circuits bonding firmness, whose principle is that after the later film is piled on top of the previous film, the upper surface of the later film will be affected by the previous film. Among the metal layers of the multi-level interconnection, the metal layer under and most close to the bond pad metal (the top metal layer of the multi-level interconnection) has a regular or an irregular layout pattern, which is under the predetermined regions serving as bond pad windows. These regular or irregular layout patterns result in a rough upper surface, and then improves the firmness of bond wires.

20 Claims, 12 Drawing Sheets

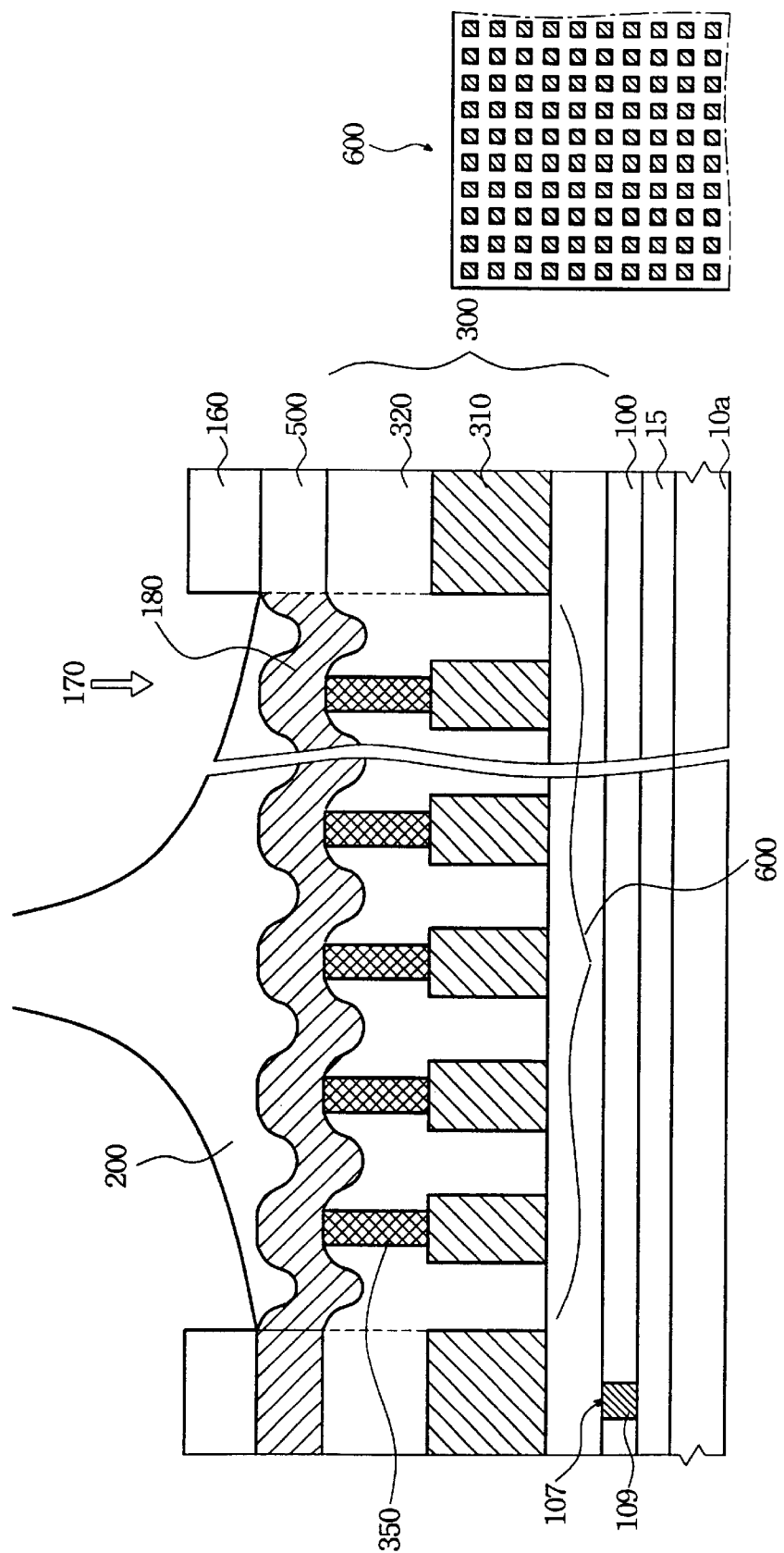

Pad - 02

Pad - 04

Pad - 06

Pad - 08

Pad - 10

Pad - 12

Pad - 14

Pad - 16

Pad - 18

Pad - 20

Pad - 22

Pad - 24

Pad - 26

Pad - 28

Pad - 30

Pad - 32

Pad - 34

Pad - 36

Pad - 38

Pad - 40

METHOD FOR IMPROVING INTEGRATED CIRCUITS BONDING FIRMNESS

This application is a divisional of application Ser. No. 09/221,569 filed Dec. 29, 1998, now U.S. Pat. No. 6,444,295.

BACKGROUND OF THE INVENTION

1. Field of the Invention

The present invention relates to a method for improving integrated circuits bonding firmness and, more particularly, to regular or irregular layout patterns formed under bond pads.

2. Description of the Prior Art

As the increment of integration, the multi-level interconnection must be used for the coupling of internal circuits during the fabrication of semiconductor devices because that the single metal connect is not sufficient for using. In general, many semiconductor devices utilize bond pads and bond wires to form the electrically coupling between internal and external circuits. Because the bond pads are formed on the upper metal layer of the multi-level interconnection, the upper metal layer of the multi-level interconnection are usually called as "bond pad metal layer". The formation of bond pads includes photolithography and etching processes to form bond pad windows in the passivation layer, which covers the devices formed previously, and then expose the predetermined areas located in the "bond pad metal layer". After the bond pad windows are formed, thin wires are bonded into the bond pad windows to couple with the predetermined areas served as bond pads.

The bond wires are tensioned and sheared during the devices are packaged, which may cause the peeling of bond wires and thus bring about the failure of the devices. There are many prior arts to solve the foregoing problem. For example, the U.S. Pat. No. 5,695,592 (Dec. 9, 1997) entitled "Method of adhesively bonding mineral particles to support" or the U.S. Pat. No. 5,700,581 (Dec. 23, 1997) entitled "Solvent-free expoxy based adhesives for semiconductor chip attachment". Another method is to modify the structure of bond pads for increasing firmness of bond wire. For example, the U.S. Pat. No. 5,686,762 (Nov. 11, 1997) titled "Semiconductor device with improved bond pads". Among these methods, the U.S. Pat. No. 5,686,762 is described accompanied with the FIG. 1. At least one opening is formed in the bonding surface of bond pads and the opening(s) 22 may recesses extending partially into the bonding surface or channels that extend entirely through the bond pad. This method increases the firmness of bond wire efficiently but additional steps are needed during the forming of opening(s) 22. Such as an additional photomask of the opening(s) 22 pattern additional photolithography process removal of the photoresistor and etching processes process and so on. In FIG. 1, the object 12 is an internal circuit; the object 16 is the bond pad window; the object 18 is a passivation layer and the object 20 is an insulator layer.

The method disclosed in the present invention is easier than aforesaid methods, because additional steps or cost is not necessary for the present invention. The feature of the present invention is to make the bonding surface of metal layer under and most close to the bond pad layer (the top metal layer of multi-level interconnection) rough, which leads to improving the firmness of bond wire. The principle of roughness process is, under the predetermined regions serve as bond pads, to form a metal layer with regular or irregular layout patterns. It's worthy to note that the roughness process is be implemented in the meanwhile of the deposition of the metal layer under the bond pad layer. In other words, it doesn't require additional steps or cost because the photomasks of layout pattern and that of metal layer are the same one.

SUMMARY OF THE INVENTION

During the devices are packaged, the break of bond wires or the peeling of bond pads occurs frequently and thus result in the failure of the devices. In order to improve the firmness of bond wires, the present invention discloses a method, which makes the metal layer under and most close to the bond pad metal layer (the upper metal layer of multi-level interconnection) rough. The method of making rough is, under the bond pad metal, to form a metal layer with regular or irregular layout patterns to result in the undulation of upper surface. The bonding surface of later bond pads formed on the metal is affected by the undulation, and thus improves the firmness of bond wires.

The preferred embodiment of the present invention is described as follow: An internal circuit is formed on a substrate by conventional method. This internal circuit comprises several metal-oxide semiconductors (MOSs) or other semiconductor devices. An insulator layer is formed on the internal circuit and then several contact holes are formed in the insulator layer by photolithography and etching processes. Several plugs are formed in the contact holes and couple to the internal circuit. A composition layer is formed, which serves as a part of the multi-level interconnection. The composition layer is composed with at least one metal layer and at least one inter-metal dielectric layer (IMD), and each film of the composition layer is piled on top of each other. The bottom and the top of the composition layer are a metal layer and a dielectric layer, respectively. There are several vias and several via plugs in each inter-metal dielectric layer, and these via plugs serve to make the metal layers coupling to the internal circuit. It's worthy to note that, under the specific regions serving as bond pads, the top metal layer of the composition layer has a regular or an irregular layout pattern.

The method disclosed in the present invention is applied in multi-level interconnection. If the number of metal layers of the multi-level interconnection is 3, the number of metal layers of the composition layer is 2; the inter-metal dielectric layers (IMD) of the composition layer serve as insulation and whose number is 2, as well.

A bond pad layer is formed on the composition layer. Then a passivation layer is formed on the bond pad layer. The passivation layer serves to protect the internal circuit from moisture and alkali ions. Then by photolithography and etching processes; bond pad windows are formed in the passivation layer to expose the bond pad layer. Finally, the bond wires are bonded to the bond pads.

After the aforesaid steps are finished, a test machine was used to test the firmness of the bond wires. The test result reveals that no matter whether ball shear test or wire pull test, the bond pads using present invention satisfy the industrial standard (wire pull is 5 mg and ball shear is 30 mg)

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein

FIG. 2(a) is a cross section view of a bond pad structure of present invention.

FIG. 2(b) is a simplified layout pattern of the present invention.

DESCRIPTION OF THE PREFERRED EMBODIMENT

Figure 1:
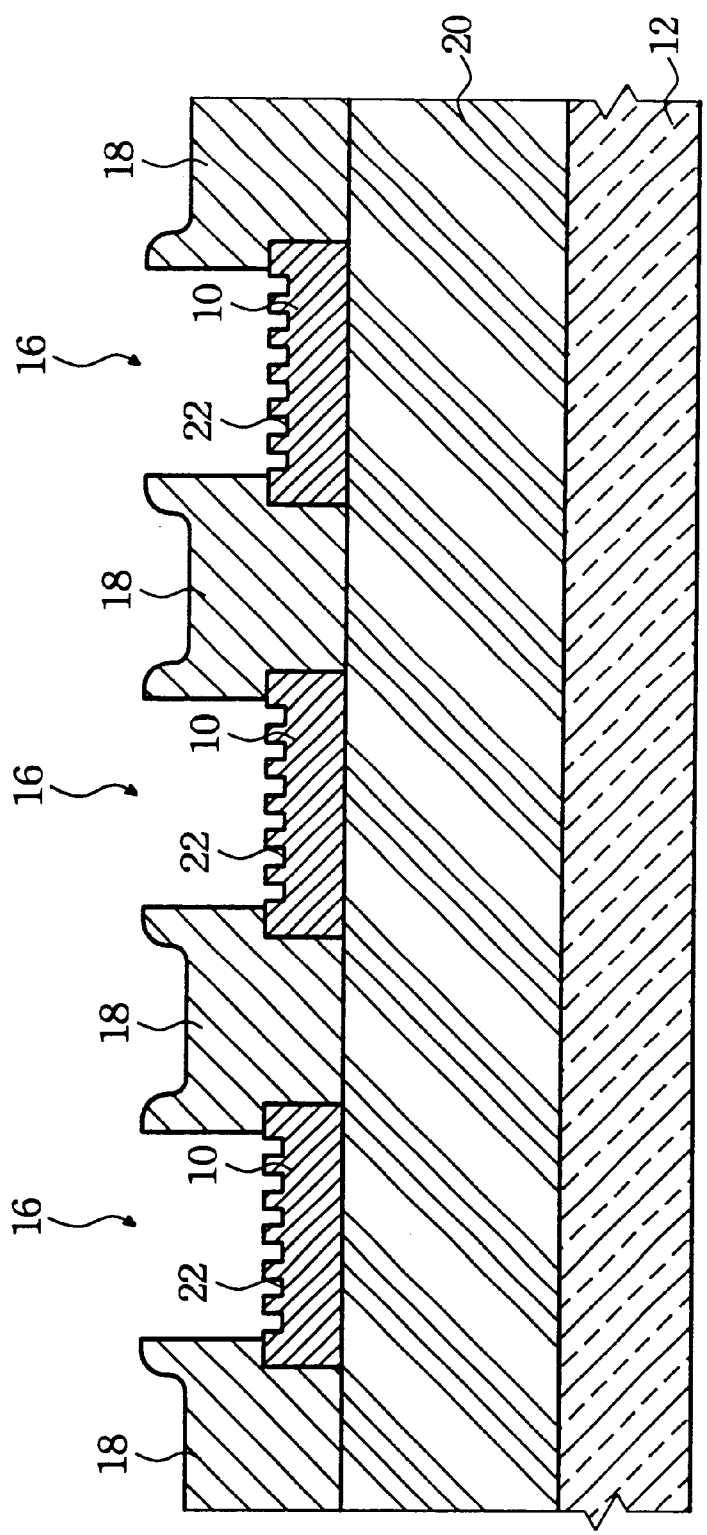
FIG. 1 is a cross section view of a bond pad structure of prior art.

A multi-level interconnection structure will be employed below to illustrate the preferred embodiment of present invention. Referring to FIG. 2(a), an internal circuit 15 is formed on a substrate 10a by using conventional method. This internal circuit 15 comprises several metal-oxide semiconductors (MOSs) or other semiconductor devices. An insulator layer 100 is formed on the internal circuit 15 and then several contact holes 107 are formed in the insulator layer 100 by photolithography and etching processes. Several plugs 109 are formed in the contact holes 107 and couple with the internal circuit 15.

Still referring to FIG. 2(a), a composition layer 300 is formed, which serves as a part of the multi-level interconnection. The composition layer 300 is composed with at least one metal layer and at least one inter-metal dielectric layer (IMD). The bottom and the top of the composition layer 300 are the metal layer 310 and the dielectric layer 320, respectively. There are a plurality of vias and a plurality of via plugs 350 in each inter-metal dielectric layer, which serve to make the metal layers of said composition layer 300 coupling to the internal circuit 15. It's worthy to note that, in some specific regions of the surface, the upper metal layer 310 of the composition layer 300 includes a regular or an irregular layout pattern 600 formed thereon (as shown in FIG. 2(b)). The purpose of the layout pattern 600 is to form a rough upper surface and thus to increase the firmness of subsequent wire bonds 200 formed thereon. This process is referred to "the roughened process", and the specific regions are under the regions 180 which serve as bond pads.

The reasons why the metal layer 310 is selected to proceed "the roughened process" are described as follow: Because the metal layer 310 is the layer under and most close to the bond pads 180, the influence of the metal layer 310 on roughness of bond pads 180's bonding surface is the most efficient than other layers. Another reason is that if forming the regular or irregular layout pattern 600 on bond pads 180's bonding surface, thus will reduce of the area of bond pads 180 and also the performance of current-transmitting.

Still referring to FIG. 2(a), a bond pad layer 500 is formed on the composition layer 300. Then a passivation layer 160 is formed on the bond pad layer 500. The passivation layer 160 serves to protect the internal circuit 15 from moisture and alkali ions. Then bond pad windows 170 are formed in the passivation layer 160 to expose the bond pads 180 by photolithography and etching processes. The dimensions of the bond pads 180 are 96×96 micrometer square as an example. Of course, other dimensions can be used. Finally, bond wires 200 are bonded to the bond pads 180 to couple to the external circuit (not shown).

Figure 3A:
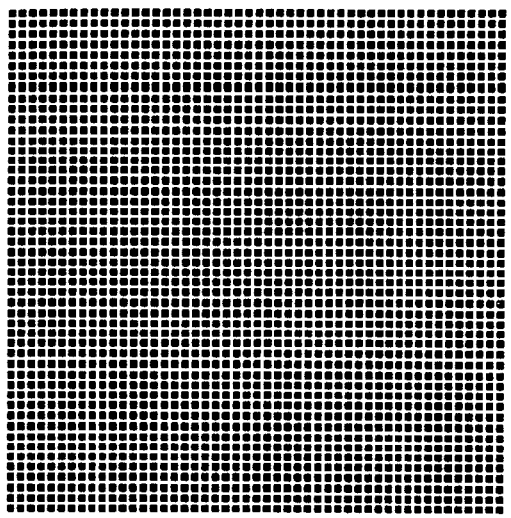
FIG. 3(a) is the practical layout pattern of FIG. 2(b)
Figure 3B:
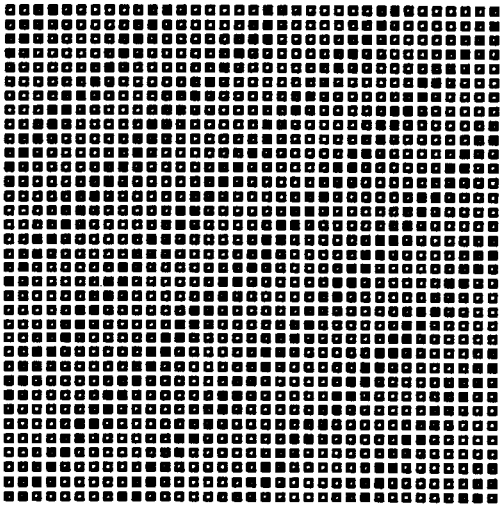
FIGS. 3(b) to (t) is the other layout patterns of present invention.
Figure 3C:
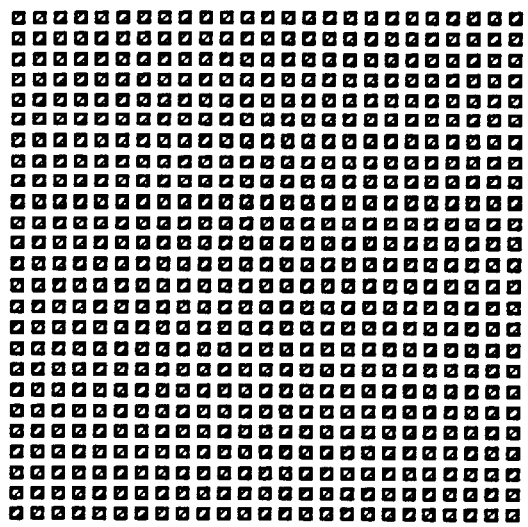
Figure 3D:
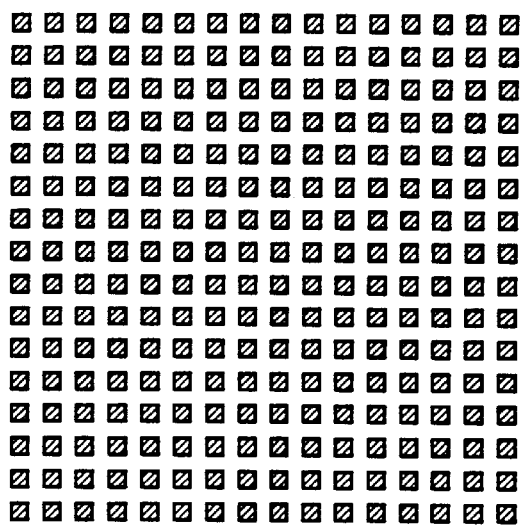
Figure 3E:
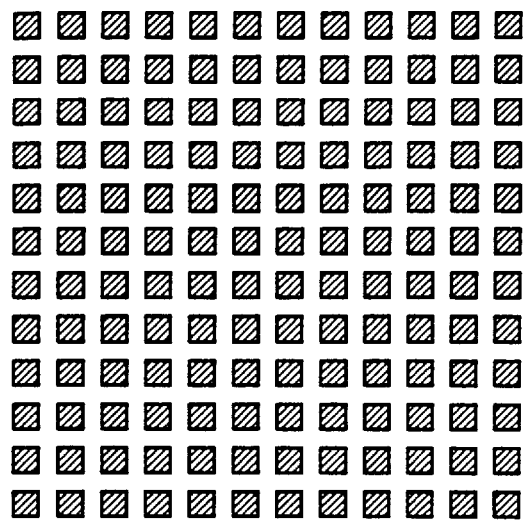
Figure 3F:
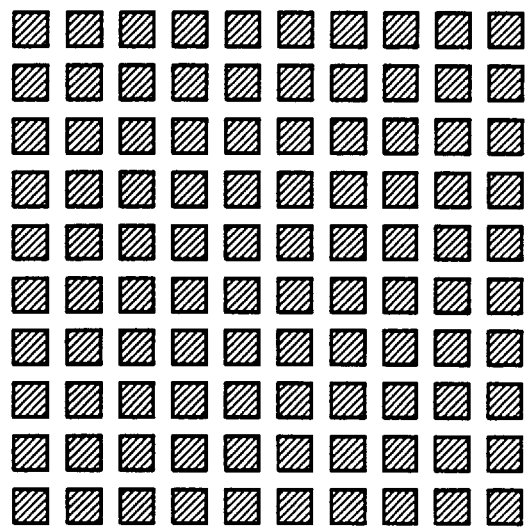
Figure 3G:
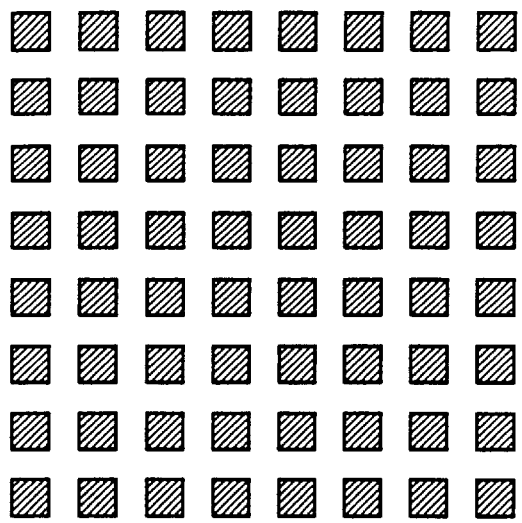
Figure 3H:
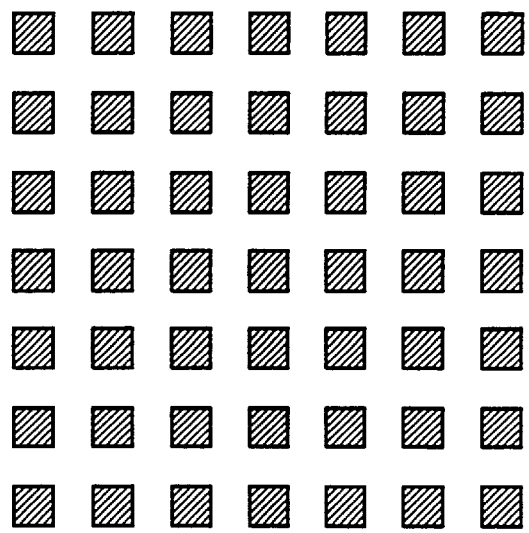
Figure 3I:
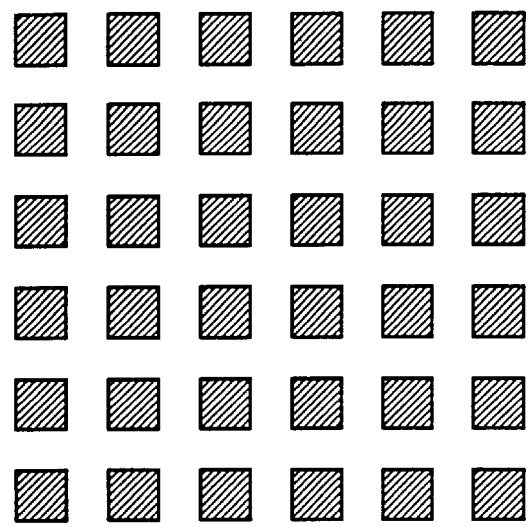
Figure 3J:
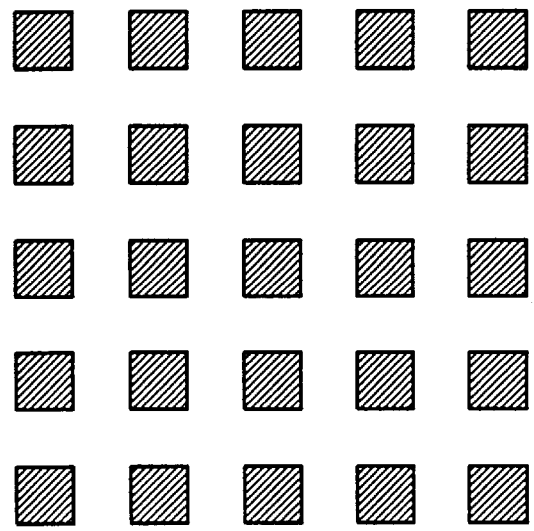
Figure 3K:
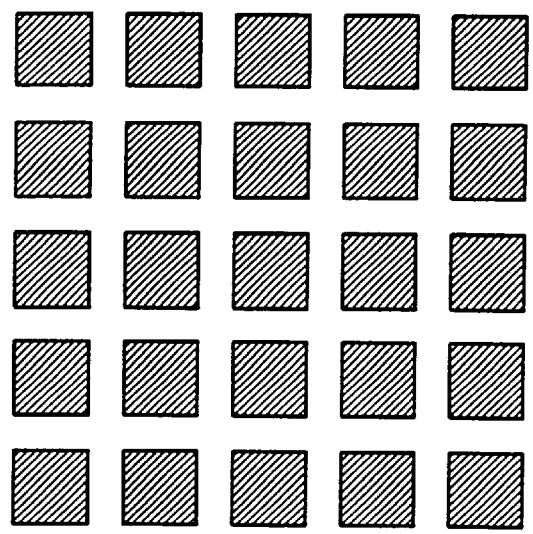
Figure 3L:
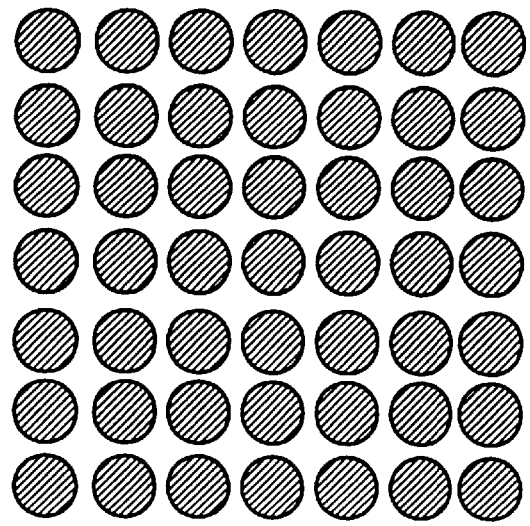
Figure 3M:
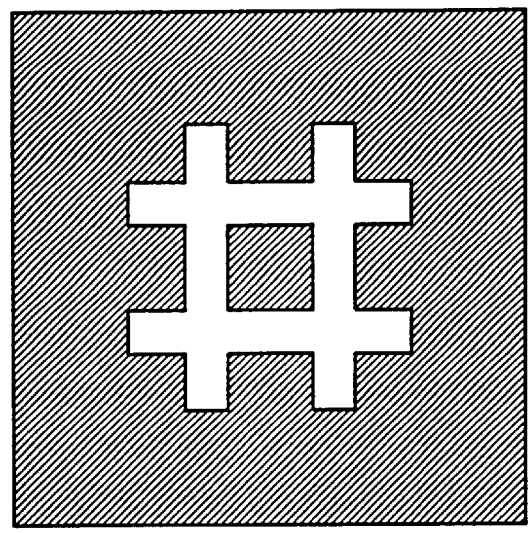
Figure 3N:
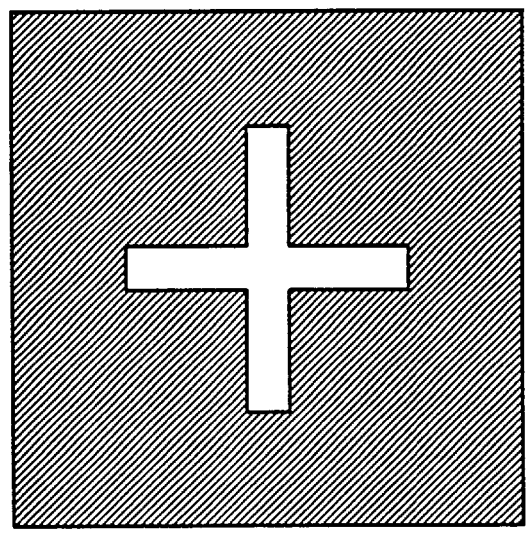
Figure 3O:
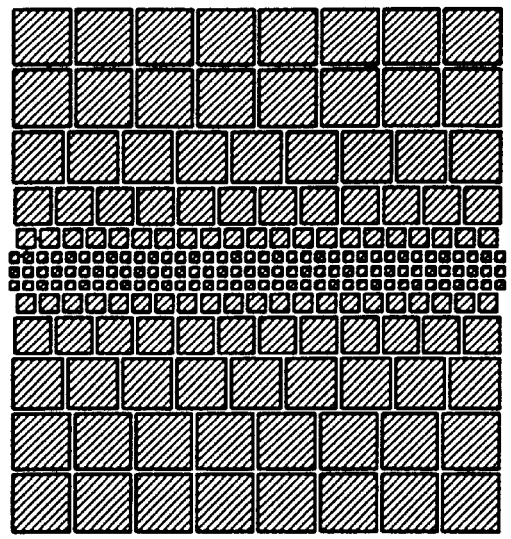
Figure 3P:
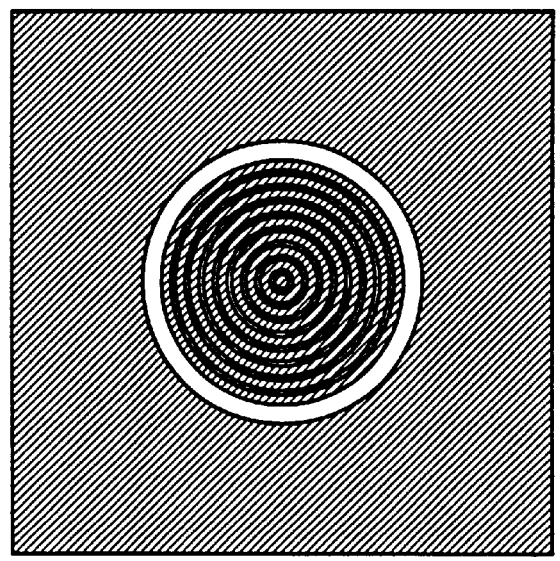
Figure 3Q:
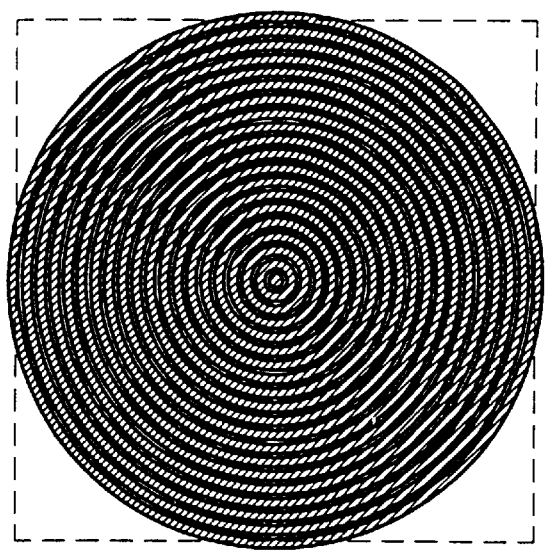
Figure 3R:
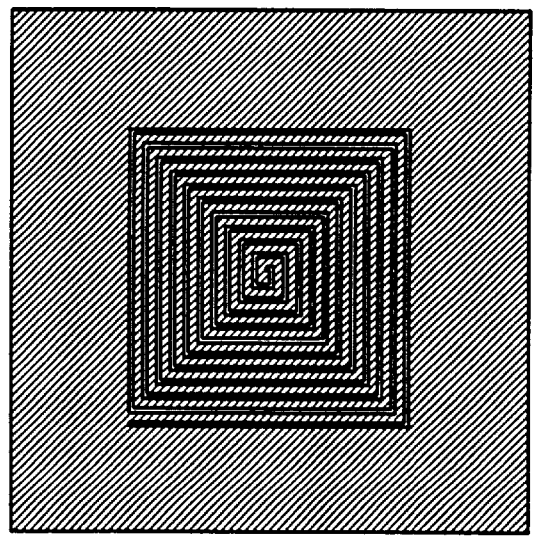
Figure 3S:
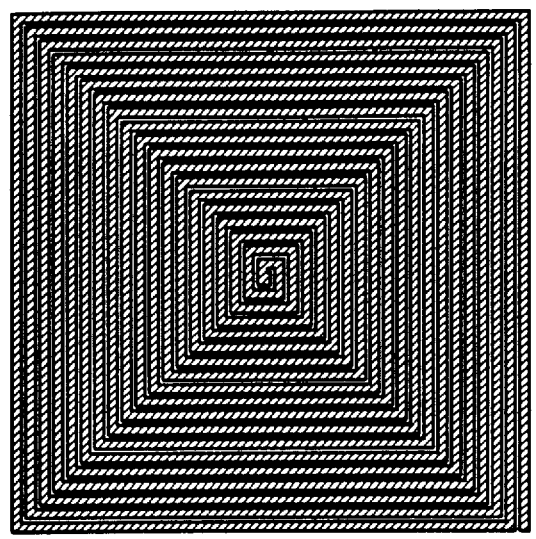
Figure 3T:
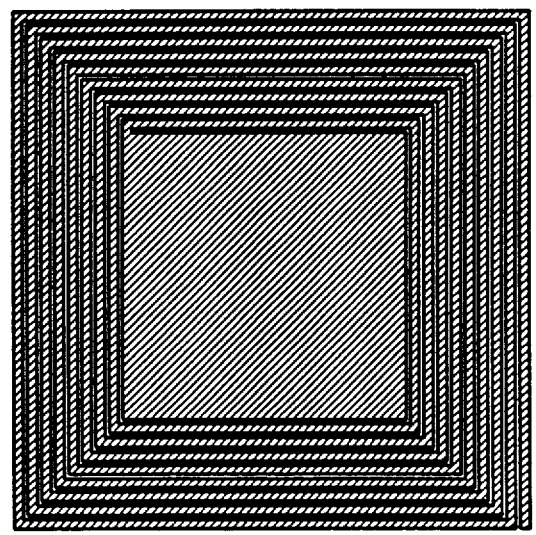

In the present embodiment, the layout pattern 600 shown in FIG. 2(b) is marked "pad-02", which is simplified for showing the drawing simply. The practical pattern of pad-02 is shown in FIG. 3(a) and also marked "pad-02". The other layout patterns shown in FIGS. 3(b) to (t) is marked "pad-04"•"pad-06" . . . . and "pad-40", respectively. These layout patterns include: a matrix composed with a plurality of squares (serial numbers are "pad-02"•"pad-04" . . . "pad-22" and shown in FIG. 3(a) to (k)). The dimensions of squares belong to the same serial number are the same, but the dimensions of squares belong to different serial number are different from each other. A matrix composed with a plurality of round dots (serial number is "pad-24" and shown in FIG. 3(l)); A "#" shaped ditch (serial number is "pad-26" and shown in FIG. 3(m)); A cross shaped ditch (serial number is "pad-28" and shown in FIG. 3(n)); An irregular pattern composed with a plurality of squares with several dimensions (serial number is "pad-30" and shown in FIG. 3(o)); Patterns composed with a plurality of concentric rings (serial numbers are "pad-32"•"pad-34" and shown in FIGS. 3(p) to (q), respectively) and irregular polygons (serial numbers is "pad-36" to "pad-40" and shown in FIGS. 3(r) to (t), respectively). On the wafer 100b and 100c, the above-mentioned steps forming bond pads 180 proceed repeatedly to make a comparison. It's worthy to note that the metal layers of present invention is a preferred embodiment, and other conductive materials suiting to serve as the multi-level interconnection are included in the scope of the present invention.

For comparing bond pads of the present invention with that of convention, in the meanwhile, a plurality of general bond pads are formed on the wafers named 100a•100b and 100c by conventional process. These general bond pads are marked serial numbers "pad-01"•"pad-03" . . . "pad-39" and whose total numbers are 20, too. Except forming the regular or irregular layout pattern, the remainder steps to form these general bond pads are the same with the forming process of bond pads 180 "pad-02"•"pad-04" . . . "pad-40".

A test machine was utilized to exam the firmness of the bond wires. The test result listed in Table-1(a) and Table-1 (b) reveal that no matter whether wire pull test or ball shear test, the bond pads of present invention (pad-02•pad-04 . . . pad-40) satisfy the industrial standard (wire pull is 5 mg and ball shear is 30 mg). Some bond pads of the present invention are more excellent than that of convention (pad-01•pad-03 . . . pad-39), and the test results of conventional bond pads are listed in Table-2(a) and Table-2(b), respectively. Hence it appears that the bond pads of the present invention are conducive to the firmness of bond wire.

TABLE 1(a)

The wire pull test of the present invention (unit:mg)

|  | wafer 100a | wafer 100b | wafer 100c | average |
| --- | --- | --- | --- | --- |
| pad-02 | 8.8 | 9.3 | 8.3 | 8.80 |
| pad-04 | 7.5 | 9.9 | 8.5 | 8.63 |
| pad-06 | 9.8 | 11.0 | 10.05 | 10.43 |
| pad-08 | 9.9 | 9.9 | 9.5 | 9.77 |
| pad-10 | 9.6 | 9.4 | 9.8 | 9.60 |
| pad-12 | 9.4 | 8.7 | 8.7 | 8.93 |
| pad-14 | 8.9 | 9.5 | 8.6 | 9.00 |
| pad-16 | 9.8 | 9.3 | 8.7 | 8.93 |
| pad-18 | 9.3 | 9.5 | 8.8 | 9.20 |
| pad-20 | 8.9 | 9.1 | 8.7 | 8.90 |
| pad-22 | 8.1 | 9.0 | 8.5 | 8.53 |
| pad-24 | 9.5 | 9.8 | 8.8 | 9.37 |
| pad-26 | 9.2 | 9.1 | 7.6 | 8.63 |
| pad-28 | 9.4 | 8.9 | 8.0 | 8.77 |
| pad-30 | 8.1 | 8.2 | 7.7 | 8.00 |
| pad-32 | 6.8 | 7.4 | 6.1 | 6.77 |
| pad-34 | 7.2 | 7.7 | 6.9 | 7.27 |
| pad-36 | 7.7 | 6.1 | 6.9 | 6.90 |
| pad-38 | 7.4 | 7.0 | 7.5 | 7.30 |
| pad-40 | 8.4 | 7.9 | 7.3 | 7.86 |

TABLE 1(a)

The ball shear test of the present invention (unit:mg)

| | wafer 100a | wafer 100b | wafer 100c | average |
|---|---|---|---|---|
| pad-02 | 46.9 | 28.6 | 26.3 | 33.93 |
| pad-04 | 41.2 | 42.1 | 36.2 | 39.83 |
| pad-06 | 42.1 | 34.8 | 45.8 | 40.9 |
| pad-08 | 44.2 | 36.2 | 63.2 | 47.87 |
| pad-10 | 37.1 | 37.9 | 46.7 | 40.57 |
| pad-12 | 43.5 | 40.6 | 37.3 | 40.46 |
| pad-14 | 38.8 | 38.5 | 49.4 | 42.23 |
| pad-16 | 35.4 | 33.3 | 35.8 | 34.83 |
| pad-18 | 36.5 | 33.2 | 37.9 | 35.87 |
| pad-20 | 32.2 | 33.1 | 32.0 | 32.43 |
| pad-22 | 32.4 | 33.3 | 30.5 | 32.07 |
| pad-24 | 30.6 | 32.2 | 31.0 | 31.27 |
| pad-26 | 36.0 | 32.7 | 30.1 | 32.93 |
| pad-28 | 34.2 | 32.8 | 30.0 | 32.33 |
| pad-30 | 34.8 | 36.5 | 29.5 | 33.60 |
| pad-32 | 32.1 | 46.4 | 38.6 | 39.03 |
| pad-34 | 30.6 | 34.1 | 35.5 | 33.40 |
| pad-36 | 38.5 | 26.8 | 38.5 | 34.60 |
| pad-38 | 35.1 | 36.0 | 30.1 | 33.73 |
| pad-40 | 30.2 | 30.8 | 33.1 | 31.37 |

TABLE 2(a)

The wire pull test of conventional bond pads (unit:mg)

| | wafer 100a | wafer 100b | wafer 100c | average |
|---|---|---|---|---|
| pad-01 | 10.2 | 9.9 | 9.1 | 9.73 |
| pad-03 | 8.3 | 8.7 | 7.3 | 8.10 |
| pad-05 | 9.0 | 9.8 | 9.4 | 9.40 |
| pad-07 | 10.0 | 10.8 | 9.2 | 10.00 |
| pad-09 | 10.1 | 10.1 | 9.8 | 10.00 |
| pad-11 | 10.0 | 9.6 | 9.7 | 9.77 |
| pad-13 | 9.2 | 9.5 | 9.3 | 9.33 |
| pad-15 | 9.0 | 8.8 | 8.8 | 8.87 |
| pad-17 | 9.3 | 8.5 | 8.9 | 8.90 |
| pad-19 | 9.9 | 9.8 | 9.3 | 9.67 |
| pad-21 | 9.8 | 8.7 | 7.8 | 8.77 |
| pad-23 | 8.0 | 7.9 | 9.7 | 8.53 |
| pad-25 | 9.1 | 8.7 | 8.7 | 8.83 |
| pad-27 | 8.9 | 8.7 | 8.9 | 8.83 |
| pad-29 | 7.9 | 7.6 | 7.5 | 7.66 |
| pad-31 | 7.3 | 7.6 | 5.3 | 6.73 |
| pad-33 | 8.4 | 7.0 | 6.1 | 7.17 |
| pad-35 | 7.3 | 8.3 | 5.5 | 7.03 |
| pad-37 | 6.9 | 7.1 | 5.4 | 6.47 |
| pad-39 | 7.2 | 6.2 | 7.7 | 7.03 |
| average | 8.84 | 8.665 | 8.17 | 8.558 |

TABLE 2(b)

The ball shear test of conventional bond pads (unit:mg)

| | wafer 100a | wafer 100b | wafer 100c | average |
|---|---|---|---|---|
| pad-01 | 40.0 | 40.0 | 44.2 | 41.53 |
| pad-03 | 49.4 | 39.8 | 43.1 | 44.1 |
| pad-05 | 41.5 | 36.1 | 39.9 | 39.17 |
| pad-07 | 46.4 | 33.4 | 53.9 | 44.57 |
| pad-09 | 43.8 | 37.2 | 44.2 | 41.73 |
| pad-11 | 38.8 | 43.7 | 40.2 | 40.90 |
| pad-13 | 40.1 | 41.0 | 44.1 | 41.73 |
| pad-15 | 37.7 | 41.5 | 39.9 | 39.70 |
| pad-17 | 37.3 | 32.3 | 53.1 | 40.90 |
| pad-19 | 37.9 | 37.2 | 37.0 | 37.36 |
| pad-21 | 41.0 | 40.1 | 36.4 | 39.17 |
| pad-23 | 39.0 | 40.1 | 36.9 | 38.67 |
| pad-25 | 38.8 | 40.5 | 35.4 | 38.23 |
| pad-27 | 39.1 | 40.0 | 39.5 | 39.53 |
| pad-29 | 35.7 | 40.9 | 34.3 | 36.97 |
| pad-31 | 43.0 | 47.6 | 40.6 | 43.73 |
| pad-33 | 40.6 | 43.6 | 32.3 | 38.83 |
| pad-35 | 38.2 | 42.1 | 32.1 | 37.47 |
| pad-37 | 39.9 | 37.4 | 38.8 | 38.70 |
| pad-39 | 40.4 | 33.0 | 31.5 | 34.97 |
| average | 40.430 | 39.395 | 39.870 | 39.898 |

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for improving the firmness of bond wires comprising the following steps:

forming a composition layer to serve as a part of multi-level interconnection, said composition layer being composed of at least one conductive layer and at least one dielectric layer wherein said at least one conductive layer and said at least one dielectric layer are piled on top each other, a surface region of said conductive layer having a regular or an irregular layout pattern to increase the roughness of said composition layer;

forming a bond pad conductive layer on said composition layer to serve as a bond pad region;

forming a passivation layer on said bond pad conductive layer;

forming a plurality of bond pad windows in said passivation layer to expose said bond pad conductive layer; and forming a plurality of bond wires in said bond pad windows to couple to an external circuit.

2. The method according to claim 1, further comprising the steps before forming said composition layer:

forming an internal circuit on a substrate, and the substrate comprises a plurality of semiconductor devices;

forming an insulator layer on said internal circuit forming a plurality of contact holes in said insulator layer; and forming a plurality of plugs in said contact holes, and couple with said internal circuit.

3. The method according to claim 1, wherein said at least one dielectric layer of said composition layer comprises a plurality of vias and a plurality of via plugs.

4. The method according to claim 1, wherein said regular layout pattern is selected from the group consisting of a matrix composed of a plurality of squares, a matrix composed of a plurality of round dots, a ring composed of a plurality of concentric rings, a cross shaped trench, a "#" shaped trench and the combination thereof.

5. The method according to claim 1, wherein said irregular layout pattern is selected from the group consisting of polygons and a pattern with a plurality of squares of several sizes, and the combination thereof.

6. The method according to claim 1, wherein said at least one conductive layer of said composition layer and said bond pad conductive layer comprise metal.

7. The method according to claim 6, wherein said metal comprises Al—Si—Cu or Al—Cu.

8. A method for improving the firmness of bond wires, the method comprising the steps of:

forming an internal circuit on a substrate;

forming an insulator layer on the internal circuit;

forming a plurality of contact holes in said insulator layer;

forming a plurality of plugs in said contact holes, and coupled with said internal circuit;

forming a conductive layer having a regular or an irregular layout pattern formed thereon to increase the roughness of a upper surface of said conductive layer;

forming a dielectric layer on said conductive layer for insulation;

forming a bond pad conductive layer on said dielectric layer to serve as a bond pad region;

forming a passivation layer on said bond pad conductive layer;

forming a plurality of bond pad windows in said passivation layer to expose said bond pad conductive layer; and forming a plurality of bond wires in said bond pad windows to couple to an external circuit.

9. The method according to claim 8, wherein said dielectric layer includes a plurality of vias and a plurality of via plugs.

10. The method according to claim 8, wherein said regular layout pattern is selected from the group consisting of a matrix composed of a plurality of squares, a matrix composed of a plurality of round dots, a ring composed of a plurality of concentric rings, a cross shaped trench, a "#" shaped trench and the combination thereof.

11. The method according to claim 8, wherein said irregular layout pattern is selected from the group consisting of polygons and a pattern with a plurality of squares of several sizes, and the combination thereof.

12. The method according to claim 8, wherein said conductive layer and said bond pad conductive layer comprise metal.

13. The method according to claim 12, wherein said metal comprises Al—Si—Cu or Al—Cu.

14. A method for improving the firmness of bond wires, the method comprising the steps of:

(a) forming an internal circuit on a substrate;

(b) forming an insulator layer on said internal circuit;

(c) forming a plurality of contact holes in said insulator layer;

(d) forming a plurality of plugs in said contact holes, and coupled with said internal circuit;

(e) forming a conductive layer having a regular or an irregular layout pattern formed thereon to increase the roughness of a upper surface;

(f) forming a dielectric layer on said conductive layer for insulation;

(g) repeating the step (e) and the step (f) several times to form a composition layer, each film of said composition layer being piled on top of each other, to serve as a part of multi-level interconnection, and said composition layer is composed of at least one conductive layer and at least one dielectric layer, an upper surface of said conductive layer having a regular or an irregular layout pattern formed thereon to increase the roughness of said upper surface;

(h) forming a bond pad conductive layer on said composition layer to serve as a bond pad region;

(i) forming a passivation layer on said bond pad conductive layer;

(j) forming a plurality of bond pad windows in said passivation layer to expose said bond pad conductive layer; and (k) forming a plurality of bond wires in said bond pad windows to couple to an external circuit.

15. The method according to claim 14, wherein a top and a bottom layer of said composition layer are a dielectric layer and a conductive layer, respectively, said dielectric layers of said composition layer including a plurality of vias and a plurality of via plugs.

16. The method according to claim 14, wherein said regular layout pattern is selected from the group consisting of a matrix composed of a plurality of squares, a matrix composed of a plurality of round dots, a ring composed of a plurality of concentric rings, a cross shaped trench, a "#" shaped trench and the combination thereof.

17. The method according to claim 14, wherein said irregular layout pattern is selected from the group consisting of polygons and a pattern with a plurality of squares of several sizes, and the combination thereof.

18. The method according to claim 14, wherein said conductive layers of said composition layer and said bond pad conductive layer comprise metal.

19. The method according to claim 18, wherein said metal comprises Al—Si—Cu or Al—Cu.

20. A method for improving the firmness of bond wires, the method comprising the steps of:

forming a composition layer on a substrate to serve as a part of multi-level interconnection, said composition layer being composed of at least one conductive layer and at least one dielectric layer wherein said at least one conductive layer and said at least one dielectric layer are piled on each other, a surface region of said conductive layer having a regular or an irregular layout pattern to increase the roughness of said conductive layer;

forming a bond pad conductive layer on said composition layer to serve as a bond pad region;

forming a plurality of bond pad windows in said bond pad conductive layer to expose said bond pad conductive layer; and forming a plurality of bond wires in said bond pad windows to couple to an external circuit for the firmness of bond wires.

* * * * *